United States Patent [19]
Okubo

[11] Patent Number: 5,740,108
[45] Date of Patent: Apr. 14, 1998

[54] SERIES-STRUCTURED READ-ONLY MEMORY HAVING WORD LINES ARRANGED INDEPENDENTLY FOR EACH ROW OF A MEMORY CELL ARRAY

[75] Inventor: Hiizu Okubo, Nishinomiya, Japan

[73] Assignee: Ricoh Company, Ltd., Tokyo, Japan

[21] Appl. No.: 762,450

[22] Filed: Dec. 9, 1996

[30] Foreign Application Priority Data

Dec. 12, 1995 [JP] Japan .................... 7-323021

[51] Int. Cl.[6] .................................. G11C 17/12
[52] U.S. Cl. .................. 365/185.17; 365/185.13; 365/185.23; 365/185.25; 365/185.06; 365/104
[58] Field of Search .................. 365/185.17, 185.13, 365/185.23, 185.25, 185.06, 104

[56] References Cited

U.S. PATENT DOCUMENTS

| | | | |
|---|---|---|---|
| 4,142,176 | 2/1979 | Dozier | 326/44 |
| 4,489,400 | 12/1984 | Southerland, Jr. | 365/104 |
| 4,980,861 | 12/1990 | Herdt et al. | 365/203 |
| 5,012,448 | 4/1991 | Matsuoka et al. | 365/208 |

FOREIGN PATENT DOCUMENTS

| | | | |
|---|---|---|---|
| 644279 | 1/1989 | Japan | G11C 17/00 |
| 127518 | 5/1989 | Japan | G11C 17/00 |
| 447464 | 8/1992 | Japan | H01L 27/112 |

*Primary Examiner*—David C. Nelms
*Assistant Examiner*—Andrew Q. Tran
*Attorney, Agent, or Firm*—Cooper & Dunham LLP

[57] ABSTRACT

A semiconductor memory device which has a reduced current consumption. A memory block includes a pair of memory cell columns each of which includes a plurality of memory cells connected in series, the memory cell columns being connected in series in a column direction along which the memory cells are arranged, a position of each of the memory cells being indicated by address data comprising first address data and second address data. Each of a plurality of word lines is connected to a corresponding one of the memory cells included in the memory block on a one to one basis. A memory cell column selection decoder selects one of the memory cell columns based on the first address data. A word line selection decoder selects one of the word lines based on the second address data and a control signal which is logically equivalent to the first address data. Additional memory blocks may be arranged in a row direction perpendicular to the column direction. Each of the bit lines may be connected to a data line via a switch unit so that one of the bit lines is precharged via the data line when the switch unit is conductive.

15 Claims, 5 Drawing Sheets

FIG.4
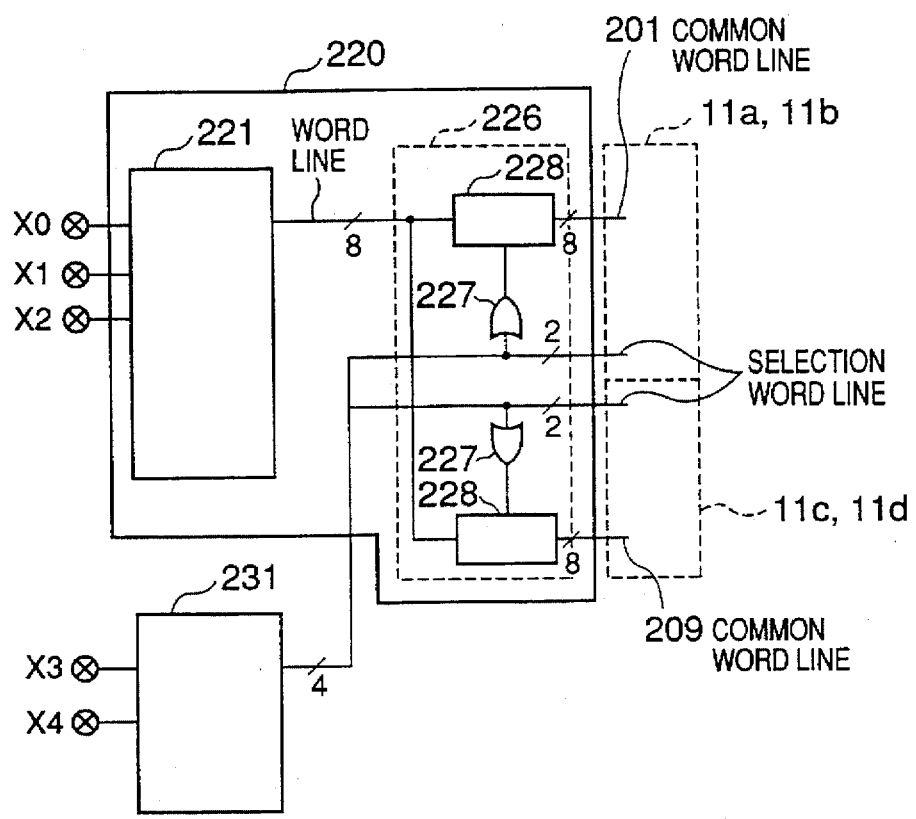
FIG.5 PRIOR ART
| MSB | | | | | LSB |
|---|---|---|---|---|---|
| A5 | A4 | A3 | A2 | A1 | A0 |
| Y0 | X4 | X3 | X2 | X1 | X0 |
FIG.6 PRIOR ART
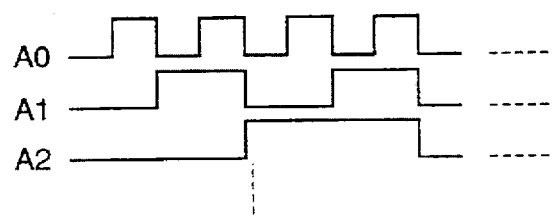

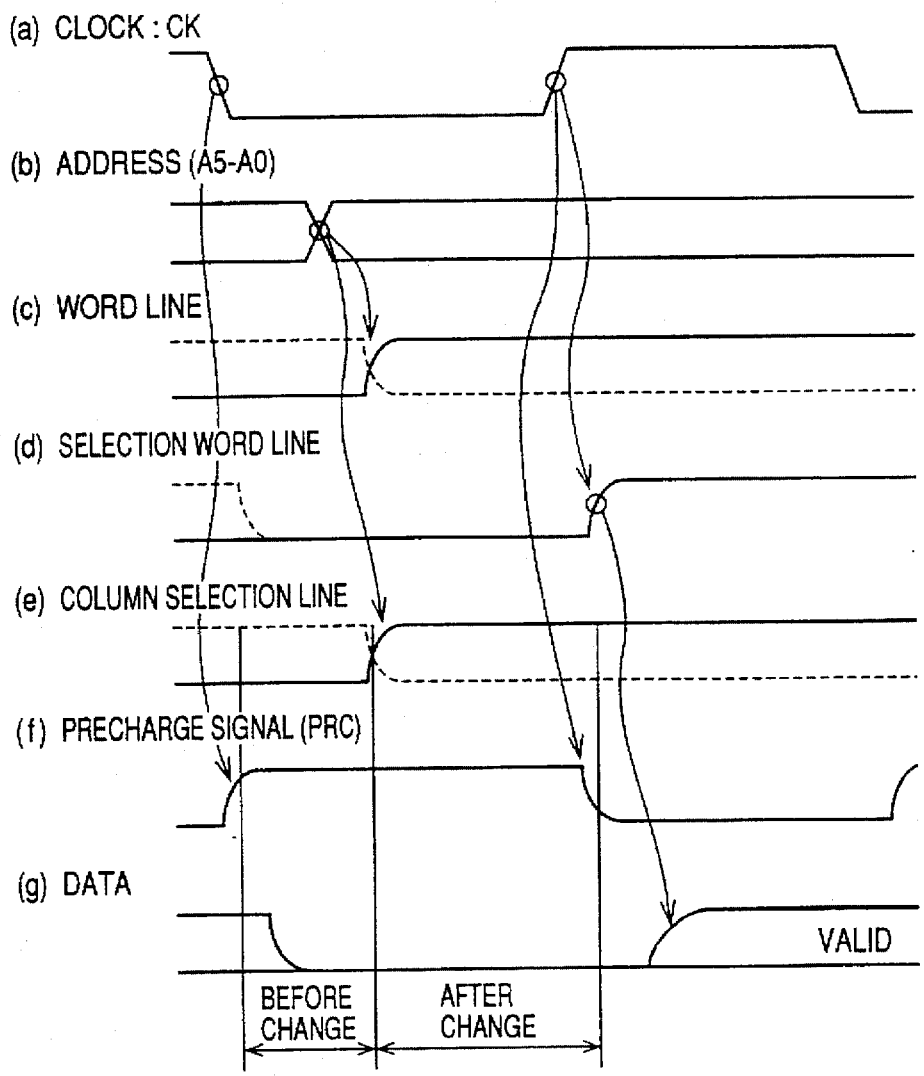

SERIES-STRUCTURED READ-ONLY MEMORY HAVING WORD LINES ARRANGED INDEPENDENTLY FOR EACH ROW OF A MEMORY CELL ARRAY

BACKGROUND OF THE INVENTION

1. Field of the Invention

The present invention generally relates to a semiconductor memory and, more particularly, to a semiconductor memory comprising a series structured read only memory generally referred to as a NAND-ROM.

2. Description of the Related Art

A part of a circuit structure of a conventional series structured read only memory (ROM) is shown in FIG. 1. The circuit structure shown in FIG. 1 corresponds to a part of a 64-word 1-bit structure. That is, the part of the circuit structure shown in FIG. 1 includes a memory group 10 which is a structural unit of groups of memories, a word line selection decoder 20, a memory cell row selection decoder 30, a bit line selection decoder 40, a clock circuit 50 and a sense amplifier 60. The memory group 10 comprises two columns of memory blocks 12a and 12b. The memory block 12a comprises a pair of memory cell columns 11a and 11c connected in series. The memory block 12b comprises a pair of memory cell columns 11b and 11d connected in series. Additionally, a common bit line 91 is provided between the memory block 12a and the memory block 12b. In this specification, a column direction indicates a direction along which memory cells are arranged along a column that is, a line in a top-to-bottom direction in FIG. 1, and a row direction indicates a direction along which memory cells are arranged along a row, that is, a left-to-right direction in FIG. 1. Although the memory group 10 comprises the two memory blocks 12a and 12b, the memory block 12a alone may be used as a minimum unit of memory group 10. In this case, the common bit line is provided for each memory block.

Each of the memory blocks 11a, 11b, 11c and 11d comprises eight memory cells 1 to 8 connected in series. One end of each of the memory cell columns 11a to 11d is grounded, and an opposite end of each of the memory cell columns 11a to 11d is connected to respective sets of selection transistors 81a to 81d and 82a to 82d which are connected to selection word lines 71 to 74 for selecting a memory cell column in the memory cell 10. That is, for example, the memory cell column 11a is connected to a set of transistors 81a and 82a connected in series. It should be noted that the selection transistors 81a, 82b, 82c and 81d are transistors of a normally-on type. Additionally, the selection transistor 82a of the memory cell column 11a is connected to the selection transistor 82c of the memory cell column 11c. The selection transistor 82b of the memory cell column 11b is connected to the selection transistor 82d of the memory cell column 11d. A connection between the selection transistors 82a and 82c and a connection between the selection transistors 82b and 82d are connected to the common bit line 91. A plurality of memory groups having the same structure may be arranged in either or both the row direction and the column direction.

For the memory cell columns 11a and 11b and the memory cell columns 11c and 11d, common word lines are used for the sake of reduction in chip size since gates of transistors corresponding to the memory cells arranged on the same row can be at the same electric potential. For example, the two memory cells 1 of the memory cell columns 11a and 11b arranged in the same row are connected to the same common word line 111a, and the two memory cells 1 of the memory cell columns 11c and 11d arranged in the same row are connected to the same common word line 111b. The common word line 111a and the common word line 111b are integrated into a single line, and connected to the word line selection decoder 20 as a word line 111.

An end of the common bit line 91 of each of the memory group 10 is connected a power source 93 for precharging via a transistor 92. The transistor 92 is controlled by a precharge signal output by a clock circuit 50. An opposite end of the common bit line 91 is connected to a data line 95 via a transistor 94. The transistor 94 is controlled by a signal supplied by the bit line selection decoder 40 via a column selection line 41.

A description will now be given of an operation of the conventional semiconductor memory device mentioned above.

A 6-bit address signal (X0–X4, Y0) is supplied to the semiconductor memory device. The address data (X0–X2) corresponding to the three least significant bits is supplied to the word line selection decoder 20, and the address data is decoded so as to select one of the word lines 111–118. In this case, the selected one of the word lines is set to a low level (L-level) and the rest are set to a high level (H-level). Thus, in the conventional semiconductor memory device, when one of the word lines are selected, two common word lines are set to the L-level. That is, for example, if the word line 111 is selected, the common word lines 111a and 111b are set to the L-level.

The 2-bit address data (X3, X4) is supplied to the memory cell column selection decoder 30, and the address data is decoded so as to select one of the selection word lines 71–74.

The common bit line 91 is precharged before the data read from the selected memory cells is sent to the bit line 91. Such a precharge operation is performed as described below. The clock circuit 50 synchronizes with a clock signal CK supplied from an external clock signal source so as to generate a precharge signal PRC when the clock signal CK is at a low level. The precharge signal PRC is supplied to each of the transistors 92 provided to the corresponding common bit lines 92. Then, each of the transistors 92 are turned on so as to conduct the power source 93 to each of the common bit lines 91. This results in each of the common bit lines 92 being set to a high level. Thereafter, the precharge operation is ended when the clock signal CK turns to a high level.

When the memory cell column selection decoder 30 is provided with the address data (X3, X4), the memory cell column selection decoder 30 outputs a high level signal to one of the selection word lines 71–74 which is designated by the address data (X3, X4), and the rest of the word lines 71–74 are maintained at a low level. One of the word lines 111–118 is selected and by selecting one of the selection word lines 71–74, one of the memory cell columns 11a–11d is selected, and a signal generated by the selected memory cell is sent to the corresponding common bit line 91. The signal read from the memory cell is sent to the sense amplifier 60 via the common bit line 91, the column selection transistor 94 and the data line 95. The signal is amplified by the sense amplifier 60, and is output from an output terminal 101 as output data of the semiconductor memory device.

In the above-mentioned conventional semiconductor device, in order to reduce the size of the semiconductor chip, each of the word lines 111–118 connected to the word line selection decoder 20 is branched to form pairs of common word lines 111a, 111b; 112a, 112b ... and 118a, 118b. Thus, when one of the word lines is selected, a pair of common word lines connected to the selected word line are activated. This increases a number of common word lines to be activated, and thus there is a problem in that the electrical current consumed by the semiconductor memory device is increased.

As apparent from the circuit diagram of FIG. 1, the precharge transistor 92 connected to each of the common bit lines 92 is controlled by the single precharge signal PRC output from the clock signal. This results in that all the common bit lines 91 are activated although it is necessary to precharge only the bit line 91 which connects to the selected memory cell before a signal is read from the selected memory cell. In the conventional semiconductor memory device, since all the common bit lines 91 are precharged at the same time, there is a problem in that the electric current consumed by the semiconductor memory device is further increased due to unnecessary activation of the common bit lines 91.

SUMMARY OF THE INVENTION

It is a general object of the present invention to provide an improved and useful semiconductor memory device in which the above-mentioned problems are eliminated.

A more specific object of the present invention is to provide a semiconductor memory device having a reduced current consumption.

In order to achieve the above-mentioned objects, there is provided according to one aspect of the present invention a semiconductor memory device comprising:

- a first memory block including a pair of memory cell columns each of which includes a plurality of memory cells connected in series, the memory cell blocks being connected in series in a column direction along which the memory cells are arranged, a position of each of the memory cells being indicated by address data comprising first address data and second address data;
- a plurality of word lines each of which is connected on a one to one basis to a corresponding one of the memory cells included in the memory block;
- a memory cell column selection decoder outputting a memory cell column selection signal for selecting one of the memory cell columns based on the first address data; and
- a word line selection decoder connected to each of the word lines for selecting at least one of the word lines based on the second address data and a control signal which is generated from the first address data.

According to the above-mentioned invention, an independent word line is connected to each of the memory cells included in the first memory block. One of the memory cells is selected by selecting one of the word lines and by selecting one of the memory cell columns. The selection of one of the word lines is based on the control signal which is logically equivalent to the second address data which is supplied to the memory cell column selection decoder. Accordingly, in the present invention, only one word line is activated from among the word lines connected to each of the memory cells included in the memory blocks when one of the memory cells is selected. Thus, the number of word lines to be activated is decreased as compared to that of the conventional semiconductor memory device in which at least two word lines are activated to select one of the memory cells. Thus, the current consumed by the word line, that is, the current consumed by the memory cells connected to the word lines, is decreased, resulting in a reduction in the current consumption of the semiconductor memory device.

In the semiconductor memory device according to the present invention, the control signal may be generated by decoding the first address data.

The semiconductor memory device according to the present invention may further comprise a bit line and a data line connected to the bit line, the bit line being connected commonly to the pair of the memory cell columns so that a signal read from one of the memory cells is output via the bit line and the data line, the bit line being precharged via the data line.

In one embodiment according to the present invention, the semiconductor memory device may further comprise a precharge unit connected to the data line and a switch unit connected between the bit line and the data line, wherein the bit line is precharged by the precharge unit when the switch unit is conductive. Additionally, the semiconductor memory device may further comprises a bit line selection decoder and a bit line selection line connected to the bit line selection decoder, the switch unit being connected to the bit line selection line, wherein third address data included in the address data is supplied to the bit line selection decoder, and the switch unit is controlled by a bit line selection signal generated by the bit line selection decoder based on the third address data.

Additionally, in the present invention, the address data comprises a plurality of bits, and the second address data corresponds to a part of the bits having an order higher than a part of the bits corresponding to the first data.

The semiconductor memory device according to the present invention may further comprise at least one second memory block constructed in a same manner as the first memory block, the second memory block being arranged in a row direction perpendicular to the column direction with respect to the first memory block, wherein each of the memory cells included in the second memory block is connected to one of the word lines which is connected to a corresponding one of the memory cells included in the first memory block.

Additionally, the semiconductor memory device according to the present invention may further comprise:

- a plurality of second memory blocks each of which is constructed in a same manner as the first memory block, the second memory blocks being arranged in a row direction perpendicular to the column direction with respect to the first memory block;
- a plurality of bit lines each of which is connected to one of the first memory block and the second memory blocks;
- a data line connected to each of the bit lines; and
- a plurality of switch units each of which is provided between one of the bit lines and the data line,
- wherein only one of the bit lines is precharged via the data line when a corresponding one of the switch units is conductive.

According to this invention, since only one of the bit lines is precharged when a signal is read from one of the memory cell, current consumed by the precharge of the bit lines is reduced as compared to the precharge operation of the conventional semiconductor device in which a plurality of bit lines are precharged at the same time. Thus, the current consumption of the semiconductor memory device according to the present invention is further decreased in addition to the reduction in current achieved by the independent word line structure mentioned above.

In one embodiment according to the present invention, the semiconductor memory device may further comprise:

a plurality of bit line selection lines each of which is connected to a corresponding one of the switch units;

a bit line selection decoder connected to each of the plurality of bit line selection lines; and a precharge unit connected to the data line, the precharge unit being adapted to be controlled by a clock signal supplied from an external clock signal source, wherein the precharge unit precharges one of the bit lines by setting one of the switch units to be conductive asynchronously with the clock signal, the word line selection decoder selecting one of the word lines asynchronously with the clock signal, the memory cell column selection decoder selecting one of the memory cell columns synchronously with the clock signal.

In the semiconductor memory device according to the present invention, the address data may further include third data supplied to the bit line selection decoder, the bit line selection decoder generating and outputting a bit line selection signal to one of the switch units based on the third address data so as to set one of the switch units to be conductive. Additionally, the address data may comprise a plurality of bits, and the third data may includes the least significant bits among the bits.

There is provided according to another aspect of the present invention a semiconductor memory device comprising:

a plurality of memory blocks each of which includes a pair of memory cell columns each of which includes a plurality of memory cells connected in series, the memory cell columns being connected in series in a column direction along which the memory cells are arranged, the memory cell blocks being arranged in a row direction perpendicular to the column direction;

a plurality of word lines each of which is connected on one to one basis to a corresponding one of the memory cells included in each of the memory blocks;

a plurality of bit lines each of which is connected to one of the memory blocks; and a data line connected to each of the bit lines, wherein one of the bit lines is precharged via the data line.

According to this invention, since only one of the bit lines is precharged when a signal is read from one of the memory cell, current consumed by the precharge of the bit lines is reduced as compared to the precharge operation of the conventional semiconductor device in which a plurality of bit lines are precharged at the same time.

The semiconductor memory device according to the above-mentioned invention may further comprise a plurality of switch units each of which is provided between one of the bit lines and the data line, wherein only one of the bit lines is precharged via the data line when corresponding one of the switch units is conductive.

Additionally, the semiconductor memory device according to the present invention may further comprise:

a plurality of bit line selection lines each of which is connected to a corresponding one of the switch units;

a bit line selection decoder connected to each of the plurality of bit line selection lines; and a precharge unit connected to the data line, the precharge unit being adapted to be controlled by a clock signal supplied from an external clock signal source, wherein the precharge unit precharges one of the bit lines by setting one of the switch units to be conductive in synchronization with the clock signal.

Other objects, features and advantages of the present invention will become more apparent from the following detailed description when read in conjunction with the accompanying drawings.

BRIEF DESCRIPTION OF THE DRAWINGS

FIG. 4 is a circuit diagram of another example of the word line selection decoder and the memory cell column selection decoder shown in FIG. 2;

FIG. 5 is an illustration of a structure of address data supplied to the conventional semiconductor memory device shown in FIG. 1;

FIG. 6 is an illustration for explaining changes in the address data shown in FIG. 5;

FIG. 7 is an illustration of a structure of address data supplied to the semiconductor memory device according to the present invention; and FIG. 8 is a timing chart for explaining an operation of the semiconductor memory device shown in FIG. 2.

DETAILED DESCRIPTION OF THE PREFERRED EMBODIMENT

Figure 1:
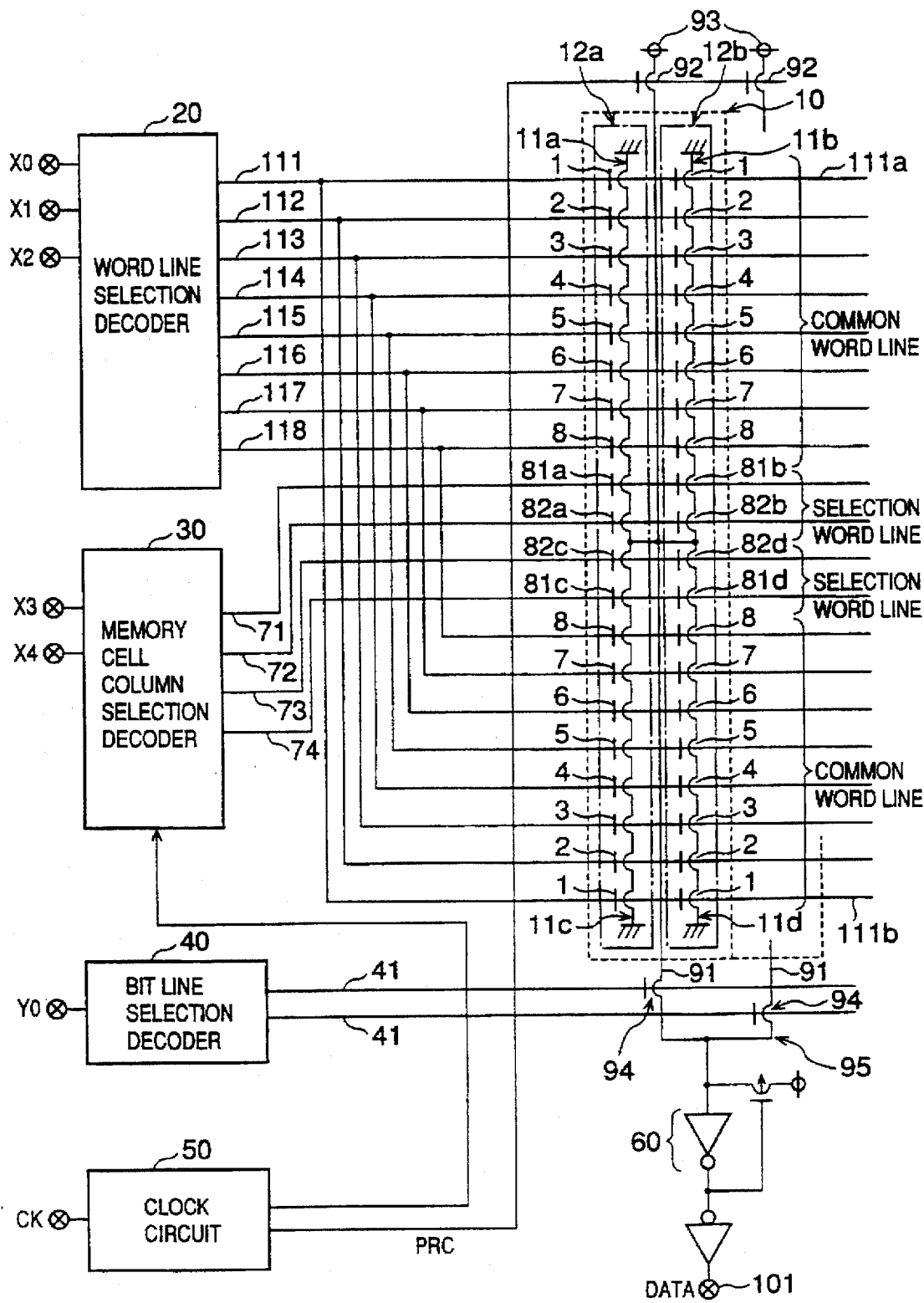
FIG. 1 is a circuit diagram of a part of a conventional semiconductor memory device.
Figure 2:
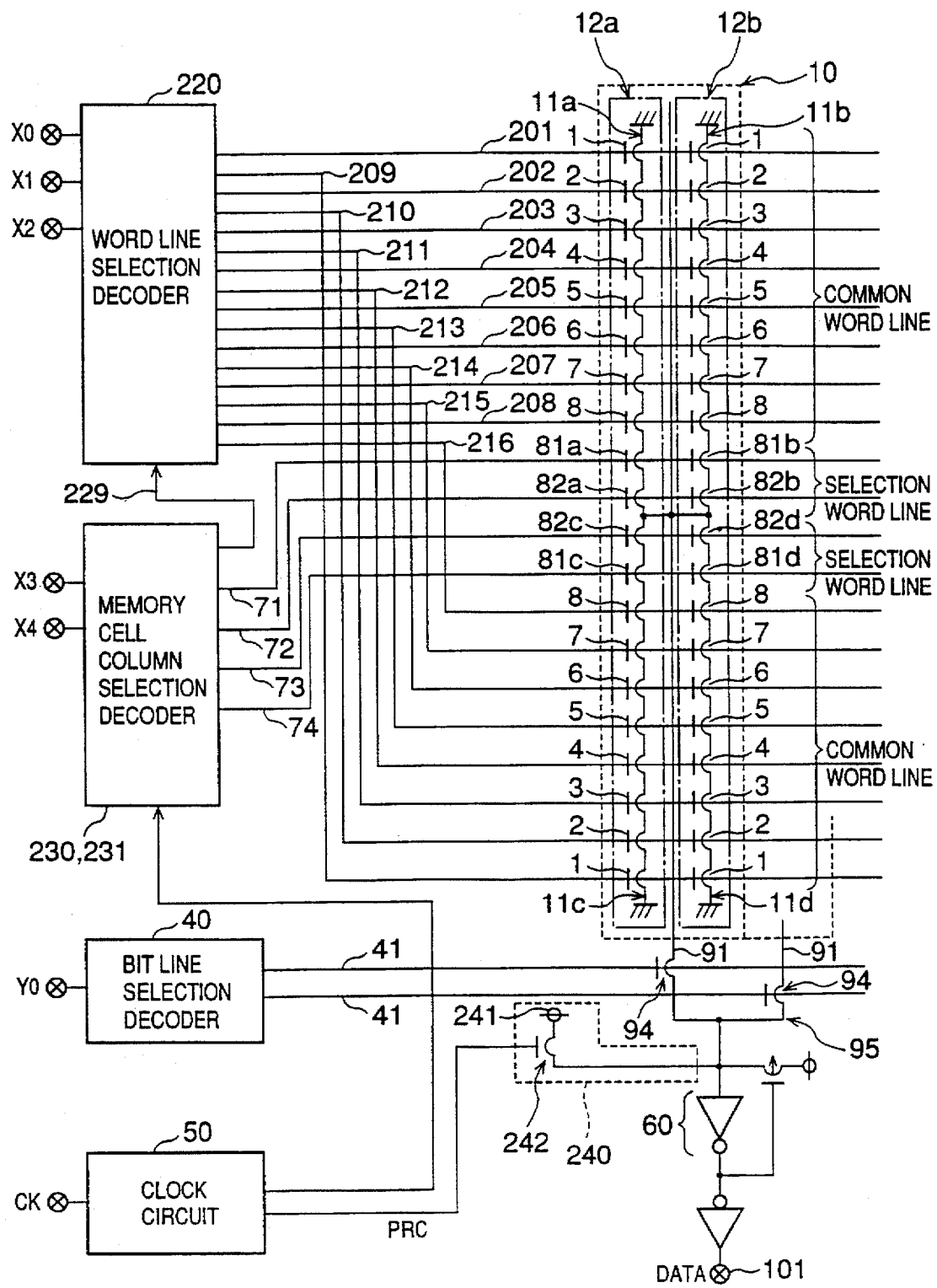
FIG. 2 is a circuit diagram of a part of a semiconductor memory device according to an embodiment of the present invention.

A description will now be given, with reference to FIG. 2, of an embodiment of the present invention. FIG. 2 is a circuit diagram of a part of a semiconductor memory device according to the embodiment of the present invention. In FIG. 2, parts that are the same as the parts shown in FIG. 1 are given the same reference numerals, and descriptions thereof will be omitted. Additionally, for the sake of convenience, the present embodiment is described based on the memory group 10 as a structural unit of the memory groups similar to the description of the conventional semiconductor memory device.

The memory group 10 comprises the memory blocks 12a and 12b. Thus, the address data supplied to a word line selection decoder 220 can be a 3-bit signal (X0, X1, X2), and the address data supplied to a memory cell column selection decoder 230 can be a 2-bit signal (X3, X4). However, the number of bits of the address data will be changed depending on the number of memory groups provided in the semiconductor memory device. It should be noted that a minimum structural unit of the memory group 10 corresponds to the memory block 12a comprising a pair of memory cell columns 11a and 11b.

In the present embodiment, the memory cell 1, for example, included in the memory cell column 11a and the memory cell 1 included in the memory cell column 11c are separately connected to the word line selection decoder 220. That is, as shown in FIG. 2, the memory cell 1 in the memory cell column 11a is connected to the word line selection decoder 220 by a common word line 201, and the memory cell 1 in the memory cell column 11c is connected to the word line selection decoder by a common word line 209 which is separate from the common word line 201.

Other memory cells 2 to 8 are connected to the word line selection decoder 220 in the same manner.

Figure 3:
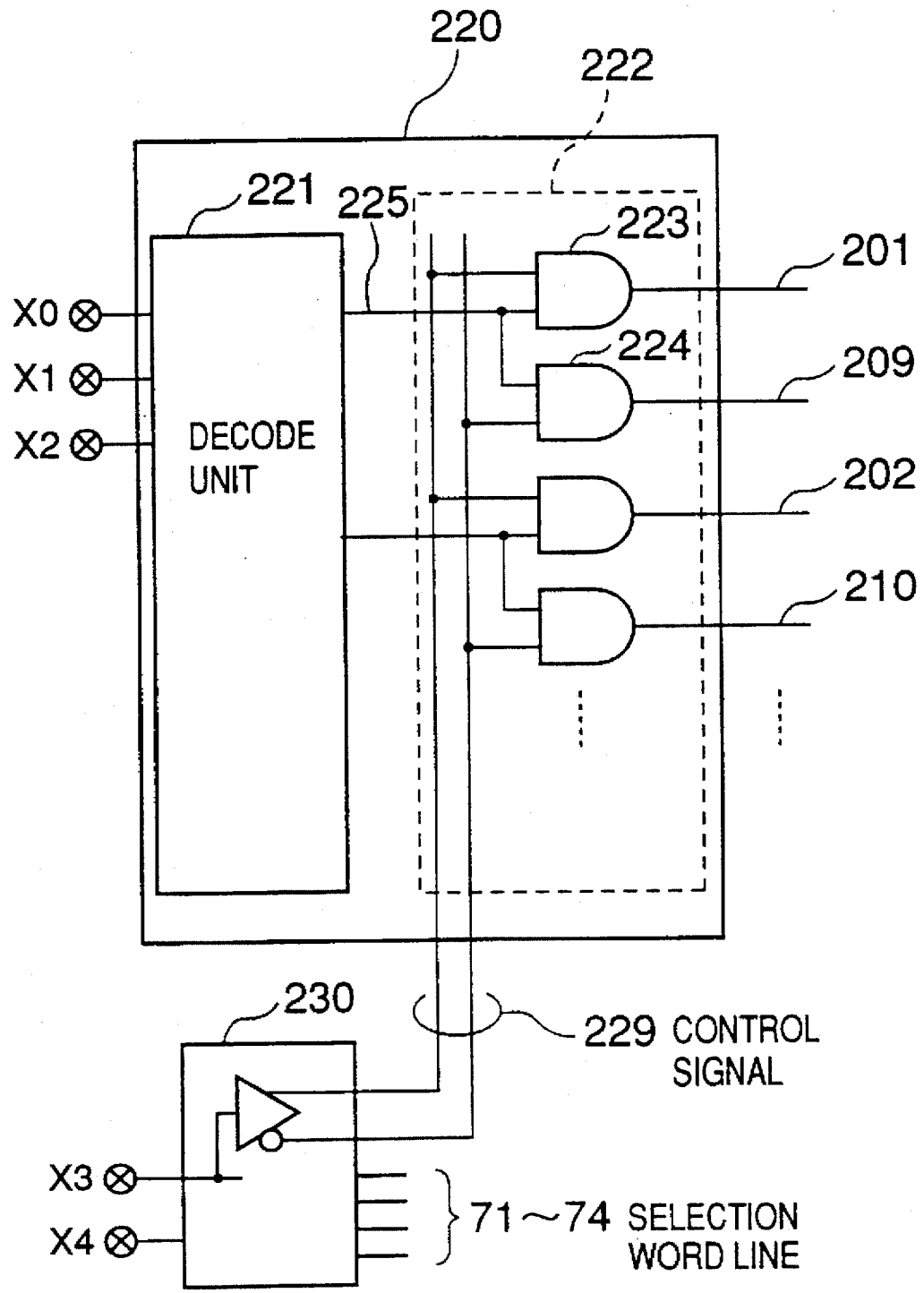
FIG. 3 is a circuit diagram of an example of a word line selection decoder and a memory cell column selection decoder shown in FIG. 2.

In the above-mentioned structure of the present embodiment, the word line selection decoder 220 comprises, as shown in FIG. 3, a decode unit 221 and a selection unit 222 so as to select one of the memory cells included in the memory cell columns 11a and 11c of the memory block 12a. The decode unit 221 decodes the 3-bit address data (X0, X1, X2). The selection unit 222 selects one of the word lines connected to the corresponding memory cells in the memory cell columns 11a and 11c. The selection unit 222 comprises AND circuits 223, 224, . . . Normal and inverted signals of the bit signal X3 included in the address data (X3, X4) supplied to the memory cell column selection decoder 230 are supplied to the AND circuits 223, 224, . . . as a control signal 229. Specifically, when an output line 225 of the decode unit 221, for example, is active, and if the bit signal X3 is "1", the AND circuit 223 becomes active. In this case, the common word line 201 connected to the memory cell 1 of the memory cell column 11a is selected. On the other hand, if the bit signal X3 is "0", the AND circuit 224 becomes active, and the common word line 209 connected to the memory cell 1 of the memory cell column 11c is selected.

FIG. 4 is another example of the word line selection decoder 220. In this example, a select unit 226 is provided instead of the select unit 223 shown in FIG. 3. The select unit 226 comprises a pair of OR circuits 227 and a pair of switch units 228 which comprises a transmission gate, for example. The OR circuits decodes a memory cell column selection signal applied by a memory cell column selection decoder 231. In the example shown in FIG. 4, the memory cell column selection signal corresponds to the control signal 229 of the example shown in FIG. 3. It should be noted that the control signal 229 is not limited to the signal output from the memory cell column selection signal, and a signal which is logically equivalent to the memory cell column selection signal may be used. In the selection unit 226, two of the common word lines are selected at the output line of the decode unit 221, for example, word lines 201 and 209 connected to the respective memory cells 1 in the memory block 12a are selected. The OR circuits 227 select one of the two word lines.

In the present embodiment, a precharge unit 240 is connected to the data line 95 for precharging one of the common bit lines 91. The precharge unit 240 comprises a precharge transistor 242 which is controlled by the precharge signal supplied by the clock circuit 50. When the precharge transistor 242 is turned on, a voltage is applied to the data line from a power source 241. As mentioned above, each of the common bit lines 91 is connected to the data line 95 via the respective transistor 94. Thus, in the present embodiment, each of the common bit lines 91 is precharged via the data line 95.

A description will now be given of an operation of the semiconductor memory device according to the present embodiment.

The word line selection decoder 220 selects one of the memory cells from among the memory cells 1 to 8 included in the memory cell columns 11a, 11c and 11b, 11d based on the address data (X0, X1, X2) supplied thereto. The word line selection decoder 220 selects one of the common word lines 201 to 216 which is connected to one of the memory cells 1 to 8 included in one of the memory cell columns 11a and 11b of the memory block 12a based on the control signal 229 supplied by the memory cell column selection decoder 230 or 231. The selected common word line is set to the low level.

As mentioned above, in the present embodiment, since only one of the word lines can be selected by the word line selection decoder 220 alone, the number of word lines selected by the word line selection decoder 220 is reduced. Thus, the number of word lines to be activated is reduced, and the current flowing in the semiconductor memory device is decreased.

Additionally, the current consumed by the semiconductor memory device can be reduced further by changing the assignment of the bit signals in the address data supplied to the word line selection decoder 220. In the conventional semiconductor memory device, the three least significant bits (X0, X1, X2) are assigned to the word line selection decoder. When a program memory of a microcomputer is concerned, address change is preformed in an ascending manner most of the times, that is, there is a high probability that an address of the memory is changed by being continuously incremented. When the address is continuously incremented, the lowest digit A0 of the address is changed each time the address is changed as shown in FIG. 6. Accordingly, when the single memory block 12a is divided into the two memory cell columns 11a and 11c as shown in FIG. 1, the load capacity of one of the word lines is twice as much as that of one of the selection word lines since, for example, the common word lines 111a and 111b are connected to the single word 111. The load capacity is increased depending on the number of words, that is, the number of transistors connected to the word line, and sometimes it is increased up to a hundred times. Accordingly, in the conventional semiconductor memory device, the word line having such a large capacity must be repeatedly charged and discharged, resulting in an increase in the current consumption. Thus, if the number of the common word lines charged at the same time is reduced as is in the present embodiment, the current consumption is decreased. Additionally, an attempt can be made to further decrease the current consumption by assigning address bits, which will be frequently changed, to a circuit having a small load capacity.

For example, if the load capacity is increased in the order of column selection line 41, selection word lines 71–74 and common word lines 210–216, the change in activation status of the common word lines can be decreased by assigning the most significant bits to the word line selection decoder. In the present embodiment, as shown in FIG. 7, the three most significant bits (X0, X1, X2) are assigned to the word line selection decoder 220, and the least significant bit Y0, which is most frequently changed, is assigned to the bit line selection decoder 40. Thus, the number of status changes in the common word lines connected to the word line selection decoder 220 is decreased. This reduces the current consumption of the semiconductor memory device.

In the present embodiment, a pair of memory cell columns are arranged in series in a single memory block, however, eight memory cell columns, for example, may be provided in a single memory block. In such a case, all the word lines connected to the memory cells included in the eight memory cell columns may be independently connected to the word line selection decoder. However, for example, four memory cell columns may be provided with the independent word lines and the rest of four memory cell columns may be provided with the common word lines similar to the conventional semiconductor memory device. This is because an increase in the number of independent word lines may increases a circuit size of the semiconductor memory device. When the independent word lines according to the present embodiment are mixed with the common word lines according to the conventional technique, an amount of decrease in the current consumption is less than that obtained when all the word lines are independently connected to the word line selection decoder. The ratio of the number of independent word lines to the number of common word lines can be determined by considering both the reduction in the current consumption and the circuit size of the entire semiconductor memory device.

A description will now be given, with reference to FIG. 8, of a precharge operation for the common bit line 91.

When the clock signal CK shown in FIG. 8-(a) falls to a low level, the precharge signal PRC shown in FIG. 8-(f) is raised to a high level, and the precharge transistor 242 is turned on in synchronization with the falling of the clock signal CK. Thus, the data line 95 is precharged by the power source 241 via the transistor 242. On the other hand, the word line selection decoder 220 selects one of the word lines 201 to 216 as discussed above. Thus, the status of the selected word line is changed as shown in FIG. 8-(c). The selection of the word line is performed based on the change in the address data. That is, the selection of the word line is not in synchronization with the clock signal CK. Additionally, the memory cell column selection decoder 230 or 231 selects one of the selection word lines 71–74 in synchronization with the clock signal CK. However, the control signal 229 output from the memory cell column selection decoder 230 or 231 is not in synchronization with the clock signal CK, but is output to the word line selection decoder 220 when the address data is changed as shown in FIG. 8-(b).

The transistor 94, which is provided for selecting the column from which the memory cell to be read is selected, is controlled by the change in the address signal Y0. That is, the transistor 94 connected to one of the column selection lines 41 selected by the address signal Y0 is turned on. Thus, the data line 95, which has already been precharged in synchronization with the clock signal CK, is conducted to the common bit line 91, through which the signal is read, via the transistor 94 which has been turned on, and thereby the common bit line 91 is precharged. Thereafter, the signal read from the selected memory cell is output as shown in FIG. 8-(g).

As mentioned above, the precharge operation for the data line 95 is started, as shown in FIG. 8-(f), in synchronization with a change such as a fall in the clock signal CK. One of the column selection lines 41 is set to a predetermined potential, as shown in FIG. 8-(e), according to the change in the address data, and one of the common bit lines 91 through which the signal is sent is precharged. Then, one of the selection word lines 71–74 is selected as shown in FIG. 8-(d) in synchronization with a change such as a rise in the clock signal CK. Thus, one of the memory cells is selected, and a signal from the memory cell is sent to the corresponding bit line 91. The precharge operation for the data line 95 is ended by the change in the clock signal CK.

In the semiconductor memory device according to the present embodiment, since the precharge is not performed for all of the common bit lines 91 but for only selected common bit lines 91, current consumption is decreased as compared to that of the conventional semiconductor memory device. Specifically, the precharge is applied to two common bit lines 91 one of which is precharged before the corresponding transistor 94 is turned off and the other one of which is precharged after the corresponding transistor 94 is turned on during the precharge operation for the data line 95. Accordingly, the number of common data lines 91 precharged at the same time is greatly reduced, resulting in a reduction in the current consumption of the semiconductor memory device.

In the above-mentioned embodiment, the memory group 10 comprises two memory blocks 12a and 12b. When additional memory groups are arranged in the row direction, memory cells are connected by the common word lines 201–216, and the number of selection word lines connected to the memory cell column selection decoder 230 or 231 is increased. On the other hand, when additional memory groups are arranged in the column direction, the number of word lines connected to the word line selection decoder 220 is increased, and the number of selection word lines connected to the memory cell column selection decoder 230 or 231 is also increased.

The present invention is not limited to the specifically disclosed embodiments, and variations and modifications may be made without departing from the scope of the present invention.

What is claimed is:

1. A semiconductor memory device comprising:
    a first memory block including a pair of memory cell columns each of which includes a plurality of memory cells connected in series, said memory cell columns being connected in series in a column direction along which said memory cells are arranged, said memory cells being selected by address data comprising first address data and second address data;
    a plurality of word lines each of which is connected on a one to one basis to a corresponding one of said memory cells included in said first memory block;
    a memory cell column selection decoder outputting a memory cell column selection signal for selecting one of said memory cell columns based on said first address data; and
    a word line selection decoder connected to each of said word lines for selecting at least one of said word lines based on said second address data and a control signal which is generated from said first address data.

2. The semiconductor memory device as claimed in claim 1, wherein said control signal is generated by decoding said first address data.

3. The semiconductor memory device as claimed in claim 1, further comprising a bit line and a data line connected to said bit line, said bit line being connected commonly to said pair of said memory cell columns so that a signal read from one of said memory cells is output via said bit line and said data line, said bit line being precharged via said data line.

4. The semiconductor memory device as claimed in claim 3, further comprising a precharge unit connected to said data line and a switch unit connected between said bit line and said data line, wherein said bit line is precharged by said precharge unit when said switch unit is conductive.

5. The semiconductor memory device as claimed in claim 4, further comprising a bit line selection decoder and a bit line selection line connected to said bit line selection decoder, said switch unit being connected to said bit line selection line, wherein third address data included in said address data is supplied to said bit line selection decoder, and said switch unit is controlled by a bit line selection signal generated by said bit line selection decoder based on said third address data.

6. The semiconductor memory device as claimed in claim 1, wherein said address data comprises a plurality of bits, and said second address data corresponds to a part of said bits having an order higher than a part of said bits corresponding to said first address data.

7. The semiconductor memory device as claimed in claim 1, further comprising at least one second memory block constructed in a same manner as said first memory block, said second memory block being arranged in a row direction perpendicular to the column direction with respect to said first memory block, wherein each of memory cells included in said second memory block is connected to one of said word lines which is connected to a corresponding one of said memory cells included in said first memory block.

8. The semiconductor memory device as claimed in claim 7, further comprising:
 a plurality of second memory blocks each of which is constructed in a same manner as said first memory block, said second memory blocks being arranged in said row direction perpendicular to the column direction with respect to said first memory block;
 a plurality of bit lines each of which is connected to one of said first memory block and said second memory blocks;
 a data line connected to each of said bit lines; and
 a plurality of switch units each of which is provided between one of said bit lines and said data line,
 wherein only one of said bit lines is precharged via said data line when a corresponding one of said switch units is conductive.

9. The semiconductor memory device as claimed in claim 1, further comprising:
 a plurality of second memory blocks each of which is constructed in a same manner as said first memory block, said second memory blocks being arranged in a row direction perpendicular to the column direction with respect to said first memory block;
 a plurality of bit lines each of which is connected to one of said first memory block and said second memory blocks;
 a data line connected to each of said bit lines; and
 a plurality of switch units each of which is provided between one of said bit lines and said data line,
 wherein only one of said bit lines is precharged via said data line when a corresponding one of said switch units is conductive.

10. The semiconductor memory device as claimed in claim 9, further comprising:
 a plurality of bit line selection lines each of which is connected to a corresponding one of said switch units;
 a bit line selection decoder connected to each of said plurality of bit line selection lines; and
 a precharge unit connected to said data line, said precharge unit being adapted to be controlled by a clock signal supplied from an external clock signal source,
 wherein said precharge unit precharges one of said bit lines by setting one of said switch units to be conductive synchronously with said clock signal, said word line selection decoder selecting one of said word lines asynchronously with said clock signal, said memory cell column selection decoder selecting one of said memory cell columns asynchronously with said clock signal.

11. The semiconductor memory device as claimed in claim 10, wherein said address data further includes third address data supplied to said bit line selection decoder, said bit line selection decoder generating and outputting a bit line selection signal to one of said switch units based on said third address data so as to set one of said switch units to be conductive.

12. The semiconductor memory device as claimed in claim 11, wherein said address data comprises a plurality of bits, and said third address data includes the least significant bits among said bits.

13. A semiconductor memory device comprising:
 a plurality of memory blocks each of which includes a pair of memory cell columns each of which includes a plurality of memory cells connected in series, said memory cell columns being connected in series in a column direction along which said memory cells are arranged, said memory cell blocks being arranged in a row direction perpendicular to the column direction;
 a plurality of word lines each of which is connected on a one to one basis to a corresponding one of said memory cells included in each of said memory blocks;
 a plurality of bit lines each of which is connected to one of said memory blocks; and
 a data line connected to each of said bit lines,
 wherein one of said bit lines is precharged via said data line.

14. The semiconductor memory device as claimed in claim 13, further comprises a plurality of switch units each of which is provided between one of said bit lines and said data line, wherein only one of said bit lines is precharged via said data line when corresponding one of said switch units is conductive.

15. The semiconductor memory device as claimed in claim 14, further comprising:
 a plurality of bit line selection lines each of which is connected to a corresponding one of said switch units;
 a bit line selection decoder connected to each of said plurality of bit line selection lines; and
 a precharge unit connected to said data line, said precharge unit being adapted to be controlled by a clock signal supplied from an external clock signal source,
 wherein said precharge unit precharges one of said bit lines by setting one of said switch units to be conductive in synchronization with said clock signal.

* * * * *